(12) United States Patent
Cho

(10) Patent No.: US 7,852,695 B2
(45) Date of Patent: Dec. 14, 2010

(54) SINGLE-ENDED DIFFERENTIAL SIGNAL AMPLIFICATION AND DATA READING

(75) Inventor: Hoyeol Cho, Palo Alto, CA (US)

(73) Assignee: Oracle America, Inc., Redwood City, CA (US)

( * ) Notice: Subject to any disclaimer, the term of this patent is extended or adjusted under 35 U.S.C. 154(b) by 195 days.

(21) Appl. No.: 12/140,387

(22) Filed: Jun. 17, 2008

(65) Prior Publication Data

US 2009/0310429 A1 Dec. 17, 2009

(51) Int. Cl.
*G11C 7/02* (2006.01)
(52) U.S. Cl. .............. 365/207; 365/185.21; 365/189.07
(58) Field of Classification Search ................. 365/207, 365/185.2, 185.22, 163, 185.24, 185.29, 365/189.03, 189.07
See application file for complete search history.

(56) References Cited

U.S. PATENT DOCUMENTS

| | | | | |
|---|---|---|---|---|
| 6,246,608 | B1* | 6/2001 | Odani | 365/185.2 |
| 2003/0169622 | A1* | 9/2003 | Ooishi et al. | 365/185.21 |
| 2008/0117685 | A1* | 5/2008 | Syzdek et al. | 365/185.21 |
| 2008/0291722 | A1* | 11/2008 | Lin et al. | 365/185.2 |

* cited by examiner

*Primary Examiner*—Dang T Nguyen
(74) *Attorney, Agent, or Firm*—Brooks Kushman P.C.

(57) ABSTRACT

A method and system that can be used with signals read from a memory cell or other feature that varies in amplitude as a function of the data being read. The data read from the memory cell may be of the type that decreases in voltage when a 'low' is being read and that remains at a predetermined voltage when a 'high' is being read. The method and system may vary a reference to voltage used to judge whether the data is being read 'low' or 'high'.

20 Claims, 3 Drawing Sheets

Speed gain

SINGLE-ENDED DIFFERENTIAL SIGNAL AMPLIFICATION AND DATA READING

BACKGROUND

1. Field of the Invention

The present invention relates to a circuit for amplifying single-ended differential signals and a method of sensing bit line data carried within the amplified signal.

2. Background Art

FIG. 1 schematically illustrates a memory system where bit line data is read from one or more memory cells. The bit line data may be read by a sense amplifier as being high or low depending on whether a voltage of the bit line (BL) is higher or lower than a reference voltage (Vref). Pressure, voltage, and temperature (PVT) variations within the system can influence the voltage differential required to properly read data from the cells. One cell may output a lower voltage than another cell or one sense amplifier may receive a lower Vref than another cell. Since the Vref is fixed and commonly supplied to each sense amplifier, the value of Vref may be selected to correspond with the worst case PVT conditions. The worst case condition compensations can require the value of Vref to be selected in a manner that insures a sufficient voltage differential. A large voltage differential can increase the time it takes to read data from the cells.

FIG. 2 graphically illustrates reading a single-ended differential signal used to carry the bit line data. A left portion of the illustration corresponds with reading a low value from a cell when BL is sufficiently less than Vref. A right portion of the illustration corresponds with reading a high value from a cell when BL is sufficiently greater than Vref. The sense amplifier is unable to properly read the data until a sufficient voltage differential is generated. As shown with respect to reading a low value, a particular period of time may have to transpire before the BL is sufficiently less than Vref. This period of time is directly proportional to the time it takes to read data from the cells.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

Figure 3:
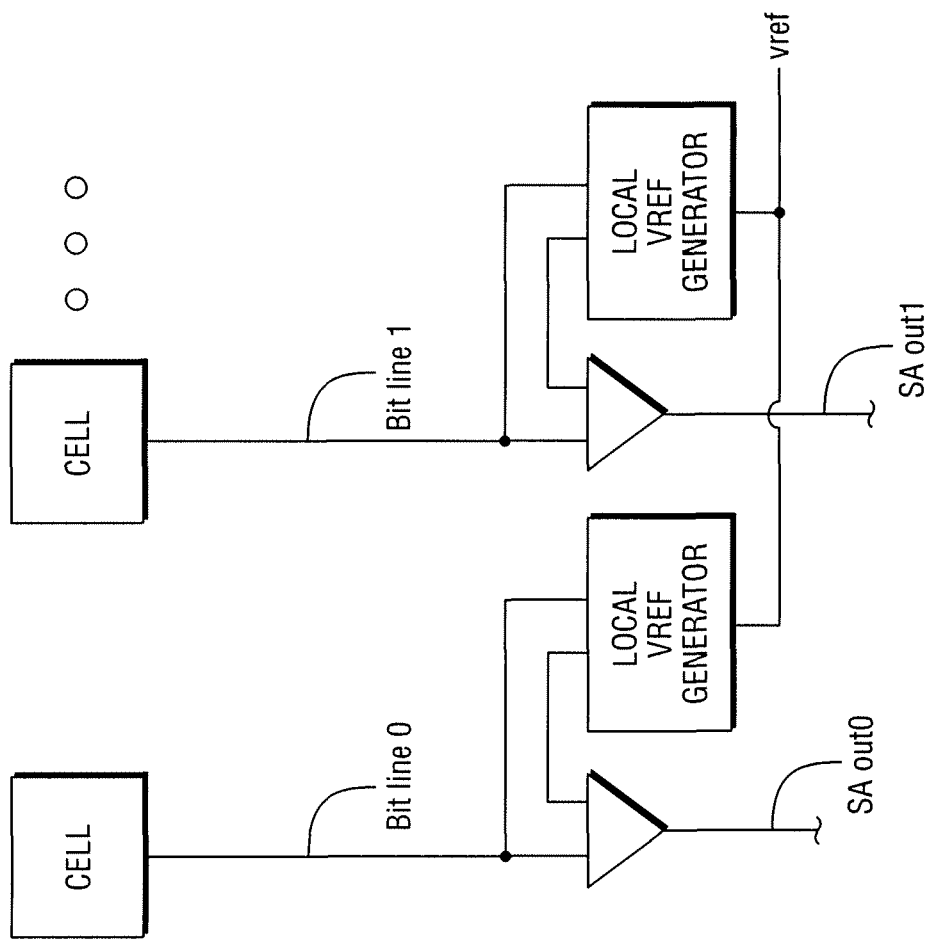
FIG. 3 schematically illustrates a system for reading bit line data in accordance with one non-limiting aspect of the present invention.
Figure 1:
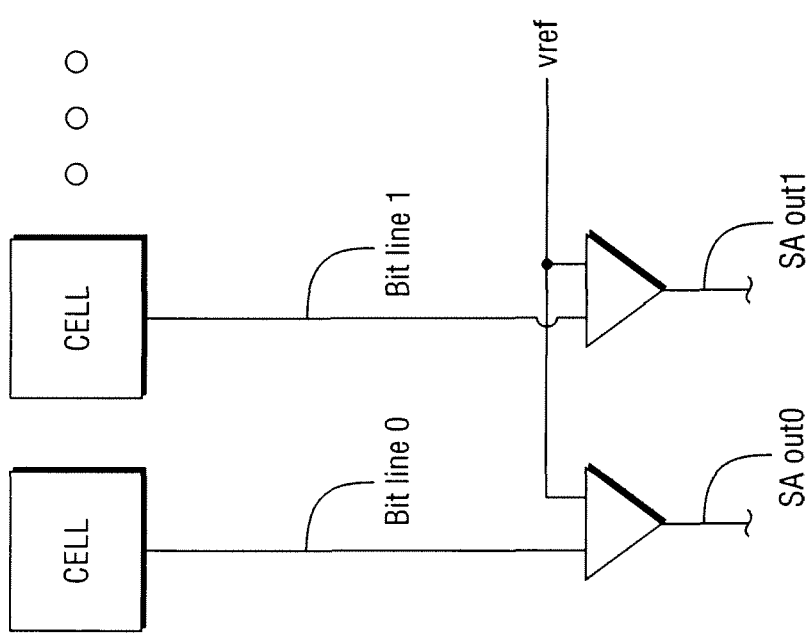
FIG. 1 schematically illustrates a memory system where bit line data is read from one or more memory cells.

FIG. 3 schematically illustrates a system for reading bit line data in accordance with one non-limiting aspect of the present invention. The system may be configured to read data from any number of memory cells. The data may be carried within bit line signals read from each of the cells. A sense amplifier may be associated with each of the bit line signals to sense whether the data carried within the associated signal is high or low. A common reference voltage (Vref) may be provided to facilitate sensing whether the data is high or low. Generally, the data is read high if a voltage of the bit line (BL) is sufficiently higher or than Vref and read low if the BL is sufficiently lower than Vref.

A local voltage generator may be associated with each of the sense amplifiers. The generators may be configured in accordance with the present invention to generate a substitute reference voltage (Vrefo). The sense amplifiers may be configured to substitute the commonly generated Vref with the Vrefo when assessing whether the BL is high or low. This substitution can be beneficial since it allows a separate and independent reference voltage to be generated at each sense amplifier. The independent reference voltages can limit inconsistencies in the system that may result from the sense amplifiers experiencing pressure, voltage, and temperature (PVT) variations.

The local voltage generators may be configured to vary Vrefo depending on whether a high or low value is being read from the cells. One non-limiting aspect of the present invention contemplates increasing Vrefo to a value greater than Vref if the bit line value is to be read low and allowing Vrefo to equal Vref if the bit line value is to be read high. This can be helpful in reducing the amount of time required for the sense amplifiers to sense a sufficient voltage difference between BL and Vrefo.

Figure 4:
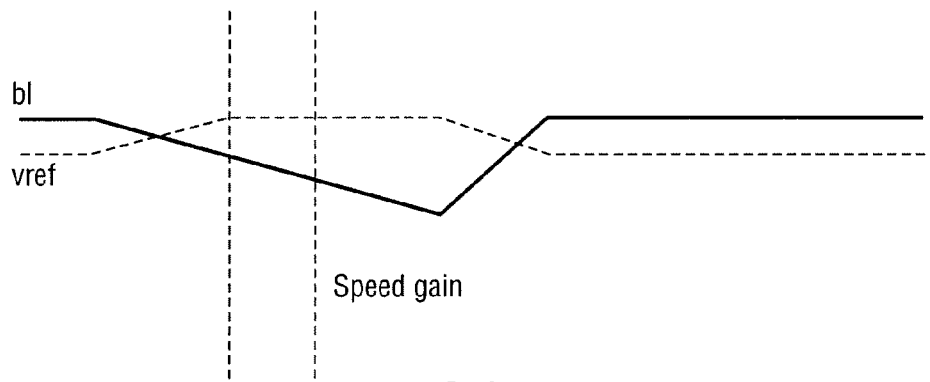
FIG. 4 graphically illustrates reading the bit line data in accordance with one non-limiting aspect of the present invention.

FIG. 4 graphically illustrates reading the bit line data in accordance with one non-limiting aspect of the present invention. A left portion of the illustration corresponds with reading a low value—BL being less than Vrefo—and a right portion of the illustration corresponds with reading a high value—BL being greater than Vrefo. A reference numeral may be used to refer to the difference in voltage required by the sense amplifier to read the data. The testing cycle time generally is limited by the length of time take to generate this difference.

The sense amplifier requires some a minimal difference between BL and Vrefo before a proper reading can occur. As such, the testing cycle time cannot be shorter than the time taken to create the voltage difference required by the particular sensitivity of the sense amplifier being used. Instead of adjusting the sensitivity of the sense amplifier, the present invention is able to use the same sense amplifier and decrease the read time by varying Vrefo so that the desired voltage difference occurs sooner.

Figure 2:
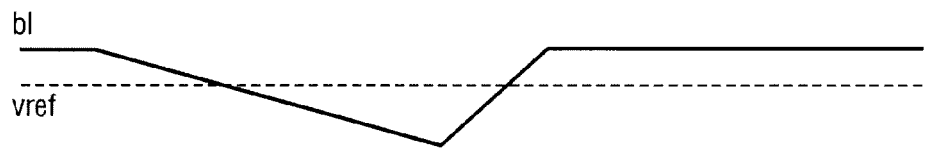
FIG. 2 graphically illustrates reading a single-ended differential signal used to carry the bit line data.

As shown in FIG. 4, the present invention increases Vrefo when low values are being read in order to produce the necessary voltage difference prior to the arrangement shown in FIG. 2. The testing cycles in FIGS. 2 and 4 are shown to correspond with the same total period of time for exemplary purpose and to demonstrate the earlier read sensitivity of the present invention. The present invention could easily decrease the cycle time by beginning subsequent read operations after the prior read operation completes.

Figure 5:
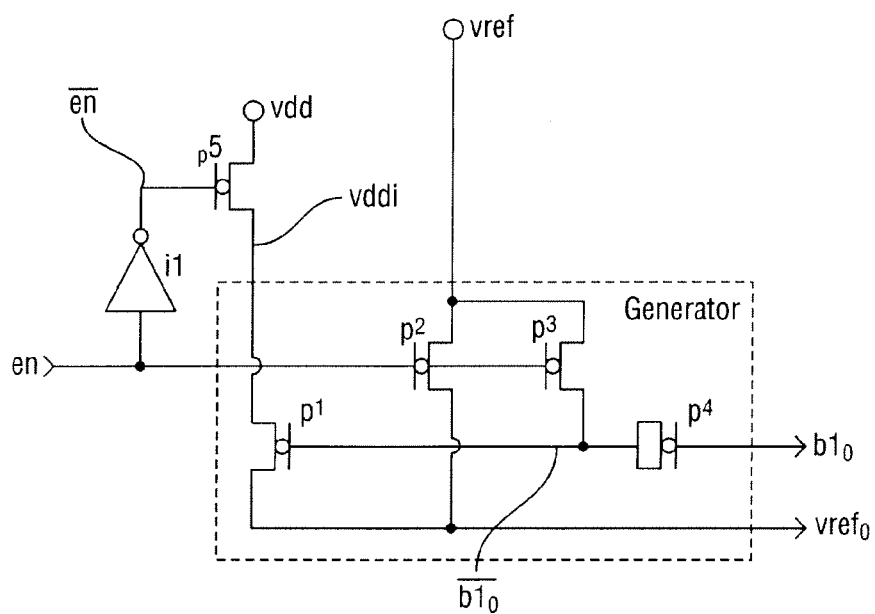
FIG. 5 schematically illustrates a circuit for reading data in accordance with one non-limiting aspect of the present invention.

FIG. 5 schematically illustrates the system in accordance with one non-limiting aspect of the present invention. The schematic illustrates a circuit arrangement that may be used to supply the voltage used by the sense amplifiers. The circuit arrangement may be configured to provide Vrefo to the sense amplifiers in the manner described above, i.e., where the Vrefo is provided at a value above Vref during a low read and at a value equal to Vref during a high read.

A source may be included for providing Vref. Another source may be included to provide a supply voltage (Vdd) used to pull Vrefo to a voltage level greater than Vref. A number of switches P1, P2, P3, P5, a capacitor P4, and inverter I1 may be included to facilitate operating the system as described in the operational charts illustrated in FIGS. 6 and 7.

Figure 6:
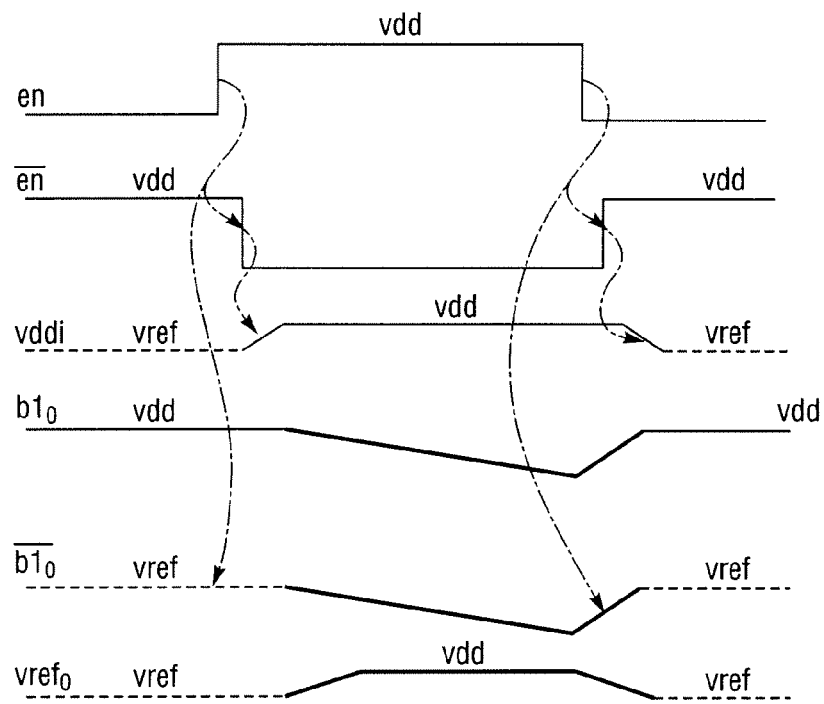
FIG. 6 illustrates reading a bit line 'low' value in accordance with one non-limiting aspect of the present invention.

FIG. 6 illustrates reading a bit line low value. An EN portion of the illustration indicates the state of EN as controlled by a controller (not shown). When EN is low, P2 and P3 are 'on' and intermediate node BL' and Vrefo are pre-charged to Vref. When EN goes high, P2 and P3 turn 'off' and I1 inverts the signal to cause EN' to go low and turn 'on' P5. P5 then pulls intermediate node Vddi up from Vref to Vdd. BL, which was pre-charged to Vdd, is pulled down when the cell begins to pull BL down with the low read value. P4 allows intermediary node BL' to remain at Vref until BL begins to pull low. Once BL' goes low, BL' is coupled down via capacitor P4. P1 is turned 'on' and Vrefo is pulled to Vdd. Since Vdd is greater than Vref, Vrefo is pulled higher as the bit line goes lower. This increases the voltage differential in the manner described above. At the end of the read cycle, EN goes low to turn P2 and P3 turn 'on' and pull Vrefo and BL' to Vref.

Figure 7:
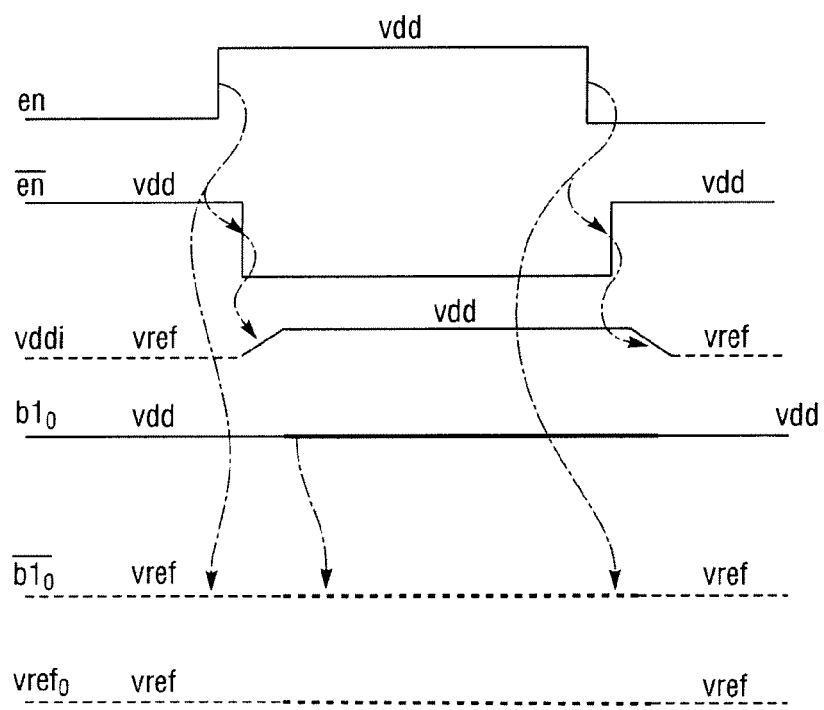
FIG. 7 illustrates reading a bit line 'high' value in accordance with one non-limiting aspect of the present invention.

FIG. 7 illustrates reading a bit line high value. A similar process occurs as with the process described above with respect to FIG. 6 except the P1 is not turned 'on' since BL remains high (at Vdd). Without Vdd to pull Vrefo to Vdd, Vrefo remains at Vref. At the end of the read cycle, EN goes low to turn P2 and P3 turn 'on' and pull Vrefo and BL' to Vref.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

What is claimed is:

1. A system comprising:
   at least first and second memory cells;
   at least first and second sense amplifiers that respectively read data from the first and second memory cells;
   at least first and second voltage generators that respectively output variable first and second reference voltages to the first and second sense amplifiers;
   wherein first sense amplifier reads data to from the first memory cell to be 'high' or 'low' depending one whether a voltage read from the first memory cell is greater than or less that the first reference voltage;
   wherein the second sense amplifier reads data to from the second memory cell to be 'high' or 'low' depending one whether a voltage read from the second memory cell is greater than or less that the second reference voltage;
   a common voltage supply that outputs a common voltage to the first and second voltage generators;
   wherein the first voltage generator increases the first reference voltage relative to the common voltage if the first memory cell begins to read 'low'; and
   wherein the second voltage generator decreases the second reference voltage relative to the common voltage if the second memory cell begins to read 'high'.

2. The system of claim 1 wherein the first voltage generator varies the first reference voltage independently of the second voltage generator.

3. A method of reading signals to be 'high' or 'low' comprising:
   determining a first signal to be 'high' if a voltage of the first signal is sufficiently greater than a first reference voltage and determining the first signal to be 'low' if the voltage is sufficiently less than the first reference voltage; and
   varying the first reference voltage used to determine whether the first signal is 'high' or 'low' depending on whether the first signal is beginning to read 'high' or 'low'.

4. The method of claim 3 wherein the first reference voltage is increased if the first signal is beginning to read 'low'.

5. The method of claim 4 wherein the first reference voltage is increased relative to a voltage supply that provides a common voltage to multiple sense amplifiers.

6. The method of claim 5 wherein the first reference voltage is held equal to the common voltage if the first signal is beginning to read 'high'.

7. The method of claim 3 wherein the first reference voltage is decreased if the first signal is beginning to read 'high'.

8. The method of claim 3 further comprising reading the first signal from a memory cell.

9. The method of claim 3 further comprising reading a second signal to be 'high' or 'low' according to whether a voltage of the second signal is sufficiently greater than or less than a second reference voltage.

10. The method of claim 9 further comprising varying the second reference voltage independently of the first reference voltage.

11. The method of claim 9 further comprising relying a common voltage source to provide a common voltage to first and second voltage generators that respectively generate the first and second reference voltages.

12. The method of claim 3 further comprising relying on a first source to provide a voltage to a first generator that generates the first reference voltage for use by a sense amplifier to determine whether the first signal is 'high' or 'low'.

13. A method of reading data from a memory cell comprising:
   comparing a voltage of the memory cell to a reference voltage that is controlled relative to a first value when the voltage of the memory cell begins to read 'low';
   determining data read from the memory cell to 'high' or low' depending on whether the voltage was greater less than the reference voltage; and
   setting the first value equal to a voltage outputted from a voltage supply, wherein the voltage outputted from the voltage supply remains fixed regardless of whether the cell beings to read 'high' or 'low'.

14. The method of claim 13 further comprising decreasing the reference voltage relative to the first value if the cell begins to read 'low'.

15. The method of claim 14 further comprising maintaining the reference voltage at the first value when the voltage of the memory cell begins to read 'high'.

16. The method of claim 13 further comprising increasing the reference voltage relative to the first value if the cell begins to read 'high'.

17. The system of claim 1 wherein the first and second voltage generators respectively wait to increase and decrease the first and second reference voltages, if necessary, until after the first and second sense amplifiers begin to sense the voltages of the first and second memory cells.

18. The system of claim 1 wherein the first reference generator determines the first memory cell to begin to read 'low' after the first sense amplifier senses the voltage of the first memory cell.

19. The system of claim 1 wherein the second reference generator determines the second memory cell to begin to read 'high' after the second sense amplifier senses the voltage of the second memory cell.

20. The method of claim 3 further comprising determining the first signal to begin to read 'high' or 'low' after sensing the first reference voltage.

* * * * *